US007009525B1

(12) United States Patent
Shafiyan-Rad et al.

(10) Patent No.: US 7,009,525 B1
(45) Date of Patent: Mar. 7, 2006

(54) MULTI-ANGLE VIEWABLE INDICATOR APPARATUS

(75) Inventors: Saeed Shafiyan-Rad, Nashua, NH (US); Daniel M. Corbosiero, Jr., Hudson, MA (US); Mark Stephen Schladenhauffen, Westford, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 509 days.

(21) Appl. No.: 09/590,922

(22) Filed: Jun. 9, 2000

(51) Int. Cl.
*G08B 5/00* (2006.01)

(52) U.S. Cl. .......................... 340/815.43; 340/815.49; 362/544

(58) Field of Classification Search .......... 340/815.43, 340/815.49, 693.5, 903, 691.1, 473, 686.1, 340/815.42, 815.5, 815.55, 815.57; 362/544, 362/546, 362
See application file for complete search history.

(56) References Cited

U.S. PATENT DOCUMENTS

| | | | | |
|---|---|---|---|---|
| 3,711,669 A | * | 1/1973 | Keranen ................. 200/137 A |
| 4,082,934 A | * | 4/1978 | Piber .......................... 200/315 |
| 4,321,443 A | * | 3/1982 | Piber .......................... 200/315 |
| 4,420,740 A | * | 12/1983 | Brown et al. ................. 340/28 |
| 4,504,830 A | * | 3/1985 | Boehme ................ 340/815.31 |
| 4,667,277 A | * | 5/1987 | Hanchar ..................... 362/250 |
| 4,954,808 A | * | 9/1990 | Duerkob ..................... 340/475 |
| 4,999,755 A | * | 3/1991 | Lin ............................ 362/250 |
| 5,151,679 A | * | 9/1992 | Dimmick ..................... 340/326 |
| 5,633,623 A | * | 5/1997 | Campman ................... 340/321 |
| D391,182 S | * | 2/1998 | Schneider et al. ......... D10/104 |
| 5,975,320 A | * | 11/1999 | Bietzer et al. .............. 215/254 |
| 5,975,716 A | * | 11/1999 | McSwiggen et al. ....... 362/249 |
| 6,044,632 A | * | 4/2000 | Schmalz et al. ......... 56/10.2 R |
| 6,215,409 B1 | * | 4/2001 | Blach ....................... 340/815.4 |
| 6,416,090 B1 | * | 7/2002 | Schechtel et al. ........... 292/303 |

OTHER PUBLICATIONS

Electro-tech systems, Inc. "Ground strap testers" (Sep. 1997).*
Electro-tech system, Inc. "Ground strap testers" (Sep. 1997).*

* cited by examiner

*Primary Examiner*—Phung T. Nguyen
(74) *Attorney, Agent, or Firm*—Amin & Turocy LLP; William R. Walbrun

(57) ABSTRACT

An indicator apparatus facilitates visibility of one or more indicators from multiple angles. The apparatus includes a housing having an outer sidewall portion. The sidewall portion, for example, has a first side extending between two adjacent sides. One or more elongated slots are formed in the sidewall portion. A substantially translucent material is disposed in the slot so that the translucent material is visible from more than one side of the housing, such as the first side and another side through which the slot extends. A light source is operatively associated with the substantially translucent material for illuminating the material. As a result, when the light source illuminates the substantially translucent material, the illuminated translucent material is visible from more than one side of the housing.

20 Claims, 2 Drawing Sheets

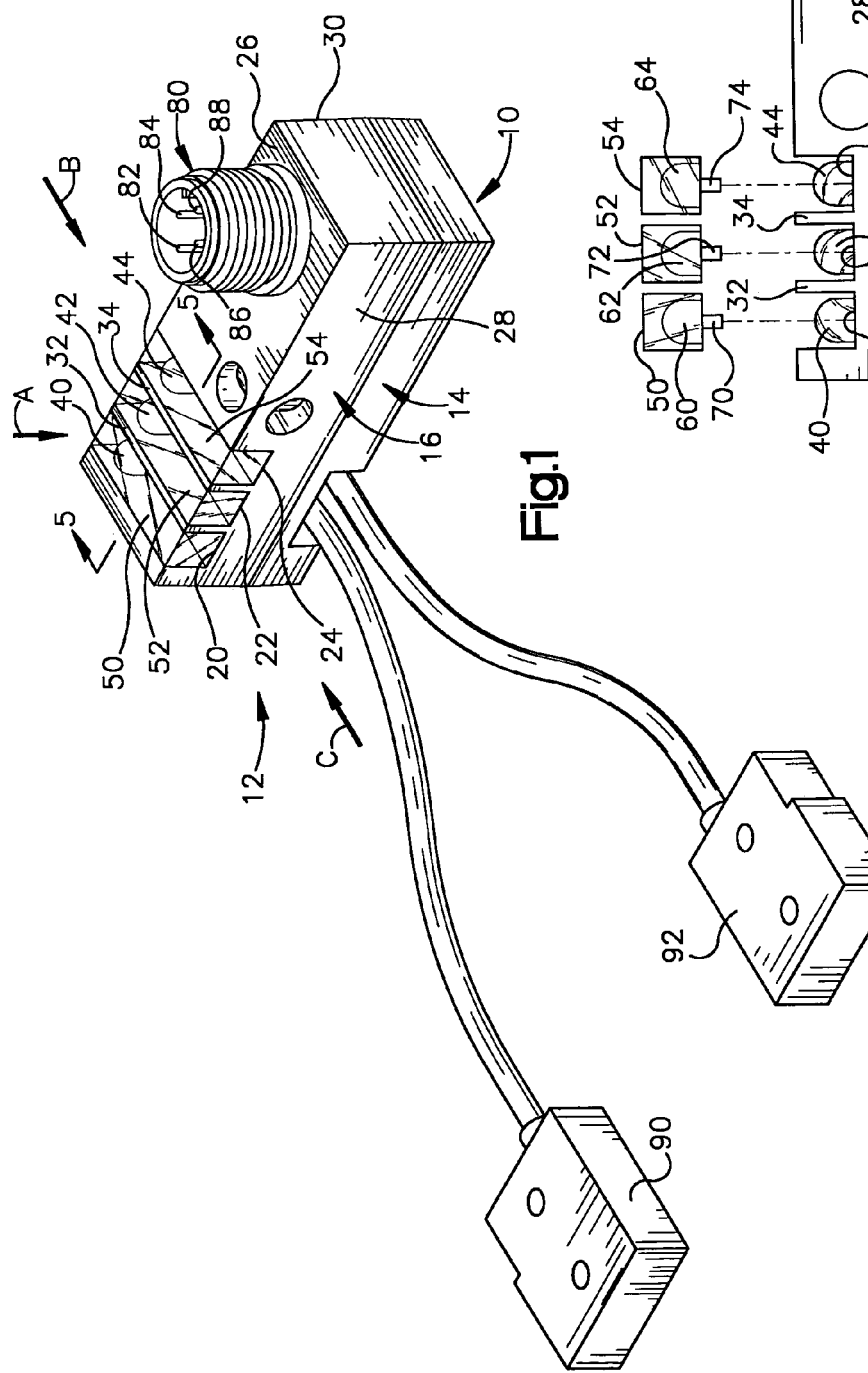
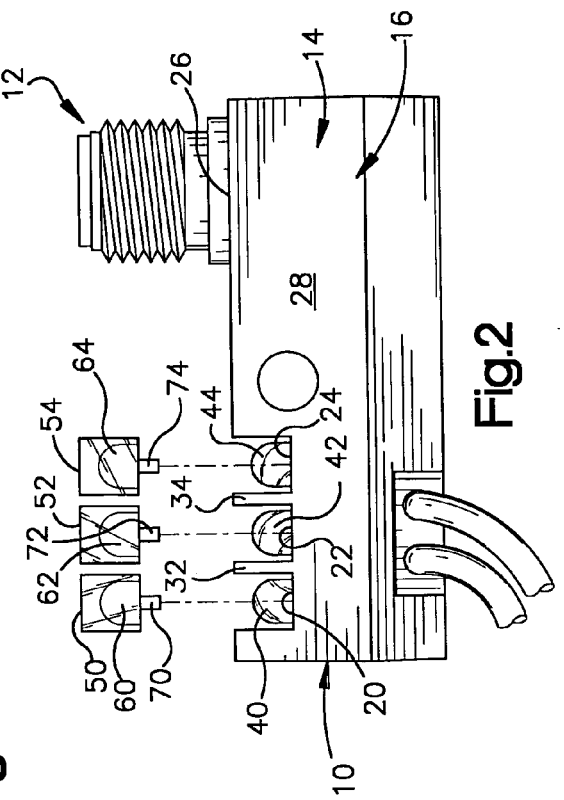

MULTI-ANGLE VIEWABLE INDICATOR APPARATUS

TECHNICAL FIELD

The present invention generally relates to an indicator arrangement and, more particularly, to an indicator apparatus having one or more indicators that are viewable from multiple directions.

BACKGROUND

Various types of proximity sensors are used for detecting the presence or absence of an object. Common types of non-contact proximity sensors include inductive proximity sensors, capacitive proximity sensors, ultrasonic proximity sensors, and photoelectric sensors. Such sensors, for example, may be used in motion or position applications, conveyor system control applications, process control applications, robotic welding applications, machine control applications, liquid level detection applications, as well as other known applications.

An inductive proximity sensor, for example, includes an oscillator that provides an oscillating signal to an inductive coil, which provides an electromagnetic field at a predetermined frequency. As an electrically conductive target moves within the field, eddy currents develop within the target in response to the oscillating electromagnetic field. The eddy currents alter the amplitude of the oscillating signal being provided to the coil. The amplitude of the oscillator signal typically is evaluated to provide an output signal indicative of the presence or absence of the object within the electromagnetic field.

One or more indicators may be associated with the proximity sensor for providing an indication of one or more corresponding operating conditions of the sensor. The indicators may be remote relative to the proximity sensor and/or located at the sensor housing. By way of example, one or more light emitting diodes (LEDs) may be mounted at the sensor housing to indicate the operating condition of the sensor system. While a conventional indicator mounting arrangement may be able to provide desired information about the operating condition of the sensor at the housing, the indicators often are not visible from different viewing angles. If the LEDs are arranged to extend outwardly from the housing so as to be sufficiently visible from different viewing angles, however, they are exposed to hazards of the operating environment in which the sensor is employed. Therefore, it is desirable to provide an indicator arrangement that provides improved visibility from multiple angles.

SUMMARY

The present invention relates to an indicator apparatus that facilitates visibility of one or more indicators from multiple viewing angles relative to the apparatus. The indicator apparatus includes a housing having an outer sidewall portion. The sidewall portion, for example, has a first side extending between two adjacent sides. One or more elongated slots are formed in the sidewall portion. A substantially translucent material is disposed in the slot so that the translucent material is visible from more than one side of the housing, such as the first side and another side through which the slot extends. A light source is operatively associated with the substantially translucent material for illuminating the material. As a result, when the light source illuminates the substantially translucent material, the illuminated material is visible from more than one side of the housing. In accordance with a specific aspect of the present invention, the light sources are recessed relative to the outer sidewall of the housing so as to mitigate damage to the light source when used in an industrial environment.

One aspect of the present invention provides an indicator apparatus. The indicator apparatus includes a housing having a first side extending between second and third sides of the housing. At least one elongated strip of substantially translucent material extends through the first side and at least one of the second and third sides so that part of the strip is visible at the first side and at the at least one of the second and third sides.

Another aspect of the present invention provides an indicator apparatus. The indicator apparatus includes a housing having a first side extending between second and third sides of the housing. At least one elongated slot is formed through the first side and at least one of the second and third sides. A substantially translucent material is disposed in the slot adjacent an associated light source, which is operative to, when activated, illuminate the translucent material. The illuminated translucent material is visible at the first side and the side (or sides) through which the slot extends.

Yet another aspect of the present invention provides a proximity sensor system. The proximity sensor system includes a proximity sensor for sensing the proximity of a target. An indicator housing has a first side extending between second and third sides. At least one elongated strip of substantially translucent material extends through the first side and at least one of the second and third sides so that part of the strip is visible at the first surface and at least one of the second and third sides. A light source has an operating characteristic indicative of an operating condition of the proximity sensor system. The light source is operatively associated with the elongated strip for illuminating the elongated strip based on the operating condition of the system.

Another aspect of the present invention provides an indicator apparatus. The apparatus includes housing means having an outer sidewall portion. Illumination means are provided for, when activated, emitting light. Substantially translucent means extend through the sidewall portion of the housing for transmitting emitted light from the illumination means so as to be visible from a plurality of sides of the outer sidewall portion of the housing means.

To the accomplishment of the foregoing and related ends, the invention, then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is an isometric view of an indicator apparatus, in accordance with the present invention, illustrated as part of a sensor system;

FIG. 2 is partially exploded side elevation of an indicator apparatus in accordance with the present invention;

DESCRIPTION OF THE INVENTION

Figure 3:
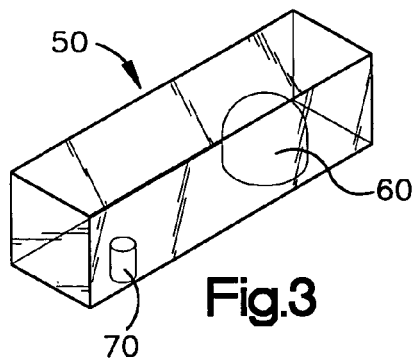
FIG. 3 is an isometric view of part of the apparatus of FIG. 2.

Various aspects of the present invention are described below in connection with FIGS. 1–6 in which like reference characters refer to like parts throughout the various views.

FIG. 1 illustrates an indicator apparatus 10, in accordance with an aspect of the present invention. While the particular indicator apparatus 10 is illustrated as being implemented as part of a proximity sensor system 12, those skilled in the art will appreciate that the indicator apparatus is applicable to other types of systems and devices and that all such uses are contemplated as being within the scope of the present invention.

The system 10 includes a housing 14 having an outer sidewall portion 16. For example, the sidewall portion 16 is a rectangular cylinder, although other shapes of housings (e.g., circular cylinder, etc.) also may be implemented in accordance with the present invention.

One or more slots 20, 22, and 24 extend through the sidewall portion 16 of the housing 14. By way of example, a plurality of elongated slots 20, 22, and 24 extend completely through a part of the housing adjacent a top side 26 thereof. That is, the slots 20, 22, and 24 extend from one side 28 through the sidewall 16 to the opposed side 30, intersecting the top side 26. Each of the slots 20, 22, 24 is separated from an adjacent slot by a substantially opaque partition 32, 34. The partitions 32 and 34 extend coextensively between the sides 28 and 30 with each adjacent pair of slots 20, 22 and 22, 24, respectively. In the illustrated example, the slots each have three sidewall surfaces that extend substantially parallel between the sides 28 and 30 of the housing 14. Because the slots 20, 22, and 24 extend completely through the housing 14 (through the sides 26, 28, and 30), the slots are exposed at the top side surface as well as at the opposed side surfaces 28 and 30.

While the slots 20, 22, and 24 are illustrated as extending substantially linearly between the side edges 28 and 30, it is to be understood and appreciated that other shapes of slot configuration may be utilized in accordance with the present invention. For example, the slots 20, 22, and 24 may extend in a curved manner (e.g., correspondingly curved partitions extending between adjacent slots) or extend only partially from one of the sides toward the other opposed side in a curved or linear manner. Furthermore, the distance between adjacent slots (e.g., the thickness of the partitions 32 and 34) may vary from that shown. For example, a greater distance (or thicker partition) or, alternatively, a lesser distance (thinner partition) may be utilized in accordance with the present invention.

As perhaps is best represented in FIG. 2, a light source 40, 42, 44 is associated with each respective slot 20, 22, 24. Each light source 40, 42, 44, which may be an LED, protrudes from the housing 14 into its corresponding slot, but is recessed relative to the outer surface of the sidewall 16. That is, the light sources 40, 42, and 44 do not extend outwardly relative to the outer sidewall 16 of the housing 14.

By way of example, each light source 40, 42, 44 may indicate a different operating condition of the system 12 in which the indicator apparatus 10 is employed. One LED 40 may emit green light, such as to indicate whether the system is connected to an appropriate power source. Another LED 42 may emit an orange light, such as to indicate a first sensing characteristic, and the third LED 44 may emit a red light to indicate a second sensing characteristic. It is to be appreciated that the colors are for purposes of clarity of explanation, as any color light may be associated with the light sources 40, 42, and 44. Additionally, while each light source 40, 42, 44 has been described as extending outwardly from a lower surface of each respective slot 20, 22, 24, alternatively, the light sources may be recessed below the lower surface of the slot so long as they are capable of providing light into their corresponding slots.

In accordance with an aspect of the present invention, a length (or strip) of a substantially translucent material 50, 52, 54 is disposed within each respective slot 20, 22, 24. Each length of the translucent material 50, 52, 54 is dimensioned and configured according to the dimensions and configurations of each corresponding slot. Alternatively, the translucent material may extend outwardly from or be recessed relative to the outer sidewall portion 16.

With reference to FIGS. 2 and 3, for example, the length of the translucent material 50 is in the form of an elongated, rectangular cylindrical strip. A receptacle 60, 62, 64 is formed into each strip 50, 52, 54 from its bottom side for receiving a portion of the light source 40, 42, 44 protruding from the lower sidewall surface of the corresponding slot 20, 22, 24. A retaining tab 70, 72, 74 also extends from the bottom side of each respective strip 50, 52, 54 spaced apart from the receptacle. The retaining tabs are configured to interlock with a corresponding receptacle (or bore) formed in the lower sidewall surface of the respective slot and spaced laterally from the light source.

The elongated strips 50, 52, and 54, for example, are formed of a generally rigid material, such as a polymer, a resin or other material, which may provide a suitable substantially translucent medium for transmitting light emitted from each associated light source. Each portion of translucent material also may be colored or stained to impart particular information or simply to help distinguish between the different strips of material. This may be in addition to or as an alternative to utilizing differently colored light sources. In addition to providing a medium for transmission of light through the housing from a respective light source, each strip also covers and protects a corresponding LED from environmental hazards.

Figure 4:
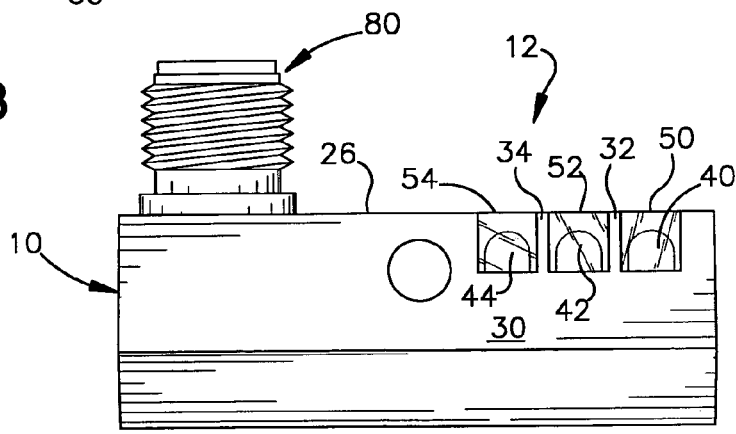
FIG. 4 is another side elevation of an indicator apparatus in accordance with the present invention.

Each strip 50, 52, 54 is located in a corresponding slot 20, 22, 24, as shown in FIGS. 1 and 4, with each light source 40, 42, 44 being received in a respective receptacle 60, 62, 64. The exposed edges of each strip at sides 26, 28, and 30, for example, substantially conform to the contour of the outer sidewall portion 16 at each adjacent side 26, 28, and 30 of the housing. That is, in the illustrated examples, each strip 50, 52, 54 has an outer surface that is substantially flush with an adjacent outer surface of the housing 14. In this way, the indicator apparatus may have a substantially smooth sidewall portion 16. As mentioned above, the strips alternatively may be recessed or extend outwardly relative to outer sidewall 16 of the housing.

Figure 5:
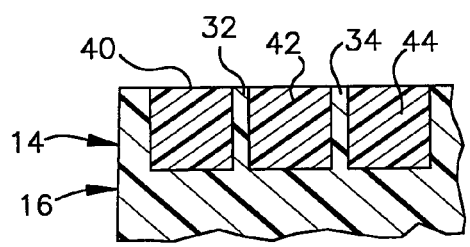
FIG. 5 is a partial sectional view of the apparatus taken along line 5—5 of FIG. 1.

FIG. 5 is a cross-sectional view of the housing 14 of the indicator apparatus 10. The strips 50, 52, and 54 are disposed in each slot, with each strip separated from another strip by an intermediate partition. The partitions 32 and 34 are illustrated as an integral part of the housing 14, although other substantially opaque means may be provided to separate the translucent strips 50, 52, and 54. For example, individual spacers or a coating of a substantially opaque material may be interposed between each pair of adjacent strips to inhibit transmission of light from one strip to another strip. For purposes of illustration, the housing 14 and the strips 50, 52, and 54 are illustrated as being formed of a plastic-like material. It is to be appreciated, however, that any suitable material may be employed to form the housing, partitions and the strips, such as metal, thermosetting resin, plastic, etc. Different materials may be selected, for example, according to the environment in which the indicator apparatus 10 is to be employed and/or the type of sensing system 12.

Referring back to FIG. 1, in order to implement a proximity sensing function, the housing 14 also includes a connector 80. The connector 80 includes a plurality of pins 82, 84, 86, and 88 for receiving power and/or providing output signals indicative of one or more operating conditions of the proximity sensing system 12. The proximity sensing system 12 also includes a pair of sensing probes (commonly referred to as chicklets) 90 and 92, which are illustrated as being remote relative to the housing 14. Each of the probes 90, 92, for example, contains a sensing coil (not shown) that is energized to provide an oscillating electric field. Alternatively, one or more sensors may be located within the housing for performing a desired sensing function. Electronics are contained within the housing 14 to monitor the oscillating signal at the probes 90 and 94 in order to determine the proximity (e.g., presence or absence) of a target relative to the respective probes. One or more of the light sources 40, 42, and 44 may be activated according to the condition at each sensor probe 90, 92 (based on the oscillating signal thereof) and/or other operating conditions of the sensing system 12.

As a light source 40, 42, 44 is activated to emit light, the associated strip 50, 52, 54 is illuminated and the illuminated strip is visible from a plurality of viewing angles, indicated by arrows A, B, and C. In particular, the illumination of each strip 50, 52, 54 is visible from the top side 26 of the housing (arrow A) and from the side surfaces 28 and 30 (arrows B and C) that the strip intersects. By knowing which color indicates which operating condition, for example, a technician or other individual may monitor the operating condition of the assembly from a plurality of viewing angles without a need to closely inspect a particular side of the housing 14. Additionally, the strips 50, 52, and 54 of translucent material are visible from two diametrically opposed sides 28 and 30 so as to be visible from diametrically opposed sides (e.g., viewing angles B and C) relative to the housing 14.

Figure 6:
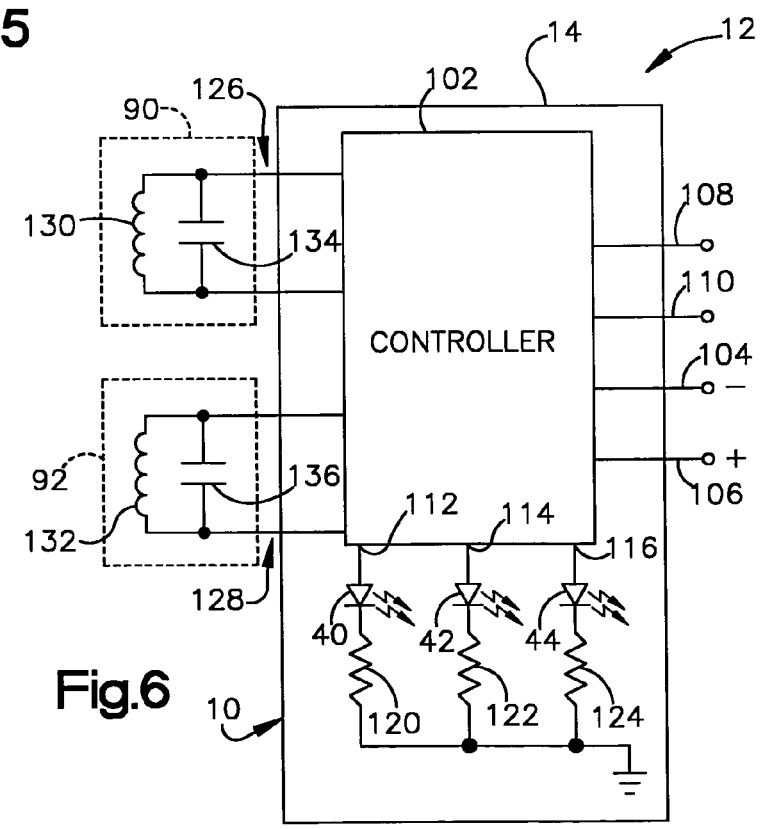
FIG. 6 is schematic representation of a proximity sensor system that may utilize an indicator apparatus in accordance with an aspect of the present invention.

FIG. 6 illustrates a schematic representation of an example of a proximity sensing system 12 corresponding to the system of FIG. 1, in which like reference numbers refer to parts previously identified with respect to FIG. 1. The system 12 includes an indicator apparatus 10 having a housing 14 that contains circuitry for performing a proximity sensing function. By way of example, the circuitry includes a controller 102, which may be programmed and/or configured to determine one or more operating conditions of the system 12 and provide output signals indicative of the determined conditions. A pair of power inputs 104 and 106 is connectable to a power source (not shown), such as a DC source, for providing electrical energy to the system 12 and, in particular, to the controller 102.

The controller 102 has a plurality of outputs 108, 110, 112, 114, and 116 for providing signals indicative of operating condition of the system 12. By way of example, The outputs 112, 114, and 116 are connected to corresponding LEDs 40, 42, and 44. Each of the LEDs 40, 42, and 44 are connected in series with a respective current limiting resistor 120, 122, 124 between the controller 102 and a reference electrical potential (e.g., ground). The controller 102 provides an output signal at each output 112, 114,116 for activating or deactivating each respective LED 40, 42, 44 according to an associated operating condition of the system 12.

One or more sensors (or sensor probes) 90 and 92 are connected to the controller 102 via connections 126 and 128, respectively, each of which is illustrated as a connector pair. As mentioned above, one or more sensors, alternatively, may be located within the housing 14. The sensors 90 and 92, may be any type of sensor, such as, for example, inductive proximity sensors, capacitive proximity sensors, ultrasonic proximity sensors, photoelectric sensors, etc. In this example, the sensors 90 and 92 are inductive proximity sensors, each represented as including an inductor 130, 132 and a capacitor 134, 136. The controller 102 provides an oscillating signal to each sensor 90, 92 for causing each sensor to oscillate and provide an oscillating electric field at a predetermined frequency. One or more characteristics (e.g., amplitude, frequency, etc.) of each oscillating signal varies as a function of the proximity of a target relative to the each respective sensor 90, 92. The controller 102 monitors the oscillating signals and provides output signals based on the monitored operating characteristics. For example, the sensor output signals may be discrete output pulses as a target enters and leaves the sensing field.

By way of example, one LED 40 may emit green light to indicate whether the system is connected to an appropriate power source. The LED 42 may emit an orange light to indicate a first sensing condition, while the LED 44 emits a red light to indicate a second sensing characteristic. In accordance with the present invention, each LED 40, 42, 44 is associated with an elongated strip of a translucent material 50, 52, 54 (FIG. 1) that is illuminated according to activation of each LED by the controller 102. Because the strips 50, 52, and 54 are visible from multiple viewing angles relative to the housing 14 (whether illuminated or not), the operating condition is easily monitored from a plurality of viewing angles. The controller 102 also provides signals to other outputs 108 and 110, which may be provided to external circuitry that, for example, may control operation of other associated equipment and/or processes (not shown).

It is to be understood and appreciated that the present invention contemplates that the apparatus 10 may contain any type of sensor, including, for example, an inductive proximity sensor, a capacitive proximity sensor, an ultrasonic proximity sensor, a photoelectric sensor, etc. In view of the foregoing description, an indicator housing arrangement in accordance with the present invention provides improved visibility of one or more indicators from a plurality of viewing angles. Additionally, the indicator lights (LEDs), which are recessed relative to the outer sidewall portion, also are protected from the environment, as each light is covered with an appropriate translucent material.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising."

What is claimed is:

1. An indicator apparatus, comprising:
  a housing having a first side extending generally between second and third sides, the hosing containing circuitry for performing a proximity sensing function;
  at least two elongated strips of substantially translucent material extending through the first side and at least one of the second and third sides so that part of each strip is visible at the first side and the at least one of the second and third sides; and
  a light source respectively associated with each of the at least two elongated strips so that light from each light source illuminates a corresponding one of the at least two elongated strips.

2. The indicator apparatus of claim 1, wherein the at least two elongated strips extends completely through the housing from the second side through to the third side and are exposed at the first side, whereby the at least two elongate strips are visible along the first side, the second side, and the third side.

3. The indicator apparatus of claim 2, wherein the second and third sides are opposed sides of the housing.

4. The indicator apparatus of claim 1, further comprising a partition of a substantially opaque material separating the at least two elongated strips.

5. The indicator apparatus of claim 1, wherein each of the at least two elongated strips extends completely through the housing from the second side through to the third side and is exposed at the first side.

6. The indicator apparatus of claim 5, wherein the second and third sides are opposed sides of the housing.

7. The indicator apparatus of claim 1, wherein the at least two elongated strips have an outer extent that substantially conforms to the contour of an adjacent outer sidewall portion of the housing.

8. The indicator apparatus of claim 1, each light source has an illuminated condition and non-illuminated condition, each condition being indicative of a condition of a monitored aspect of system coupled to the indicator apparatus, and where a plurality of light sources each indicate a condition of a different monitored aspect of the system.

9. The indicator system of claim 1, further comprising at least one retraining tab associated with the at least one elongated strip of substantially translucent material, the retaining tab secures the at least one elongated strip of substantially translucent material to the housing.

10. An indicator system, comprising:
  a housing having a first side extending between second and third sides, at least two elongated slots formed in the housing extending through the first side and at least one of the second and third sides, the housing containing an object detection circuit; and
  a substantially translucent material being disposed in the slot adjacent a light source, repectively associated with each of the at least two elongated slots, that are operative to, when activated, illuminate the translucent material, the translucent material being visible at the first side and the at least one of the second and third sides.

11. The indicator system of claim 10, wherein the at least two elongated slots extends completely through the housing from the second side through to the third side and provides an opening along the first side, whereby the substantially translucent material is visible at the first side, the second side, and the third side.

12. The indicator system of claim 11, wherein the second and third sides are opposed sides of the housing.

13. The indicator system of claim 10, further comprising: translucent material being disposed in each of the at least two elongated slots so that the translucent material is visible at the first side and the at least one of the second and third sides.

14. The indicator system of claim 13, light from each light source illuminates the translucent material in a corresponding one of the at least two elongated slots.

15. The indicator system of claim 14, wherein each of the at least two elongated slots extends completely through the housing from the second side through to the third side and provides an opening along the first side.

16. The indicator system of claim 15, wherein the second and third sides are opposed sides of the housing.

17. The indicator apparatus of claim 10, wherein the at least two elongated slots have an outer extent that substantially conforms to the contour of an adjacent outer sidewall portion of the housing.

18. The indicator system of claim 10, wherein each light source has an illuminated condition and non-illuminated condition, each condition being indicative of an operating condition of the indicator system.

19. An indicator apparatus, comprising:
  housing means having an outer sidewall portion and a network means that detects an object;
  illumination means for, when activated, emitting light so as to represent an operating condition of the indicator system; and
  substantially translucent means affixed to the housing means by a retaining tab and extending through a plurality of sides of the sidewall portion of the housing means for transmitting emitted light from the illumination means so as to be visible from the plurality of sides of the outer sidewall portion of the housing means.

20. A proximity sensor system, comprising:
  a proximity sensor for sensing the proximity of an object;
  an indicator housing having an outer sidewall portion with a plurality of sides;
  at least two elongated strips of substantially translucent material extending through at least one side of the sidewall portion through to another side of the sidewall portion so that part of each strip is visible at the at least one side and the another side of the sidewall portion; and
  a light source operatively associated with each of the at least two elongated strips, each light source being operative to, when activated, illuminate a corresponding one of the at least two elongated strips, the light sources being activated based on an operating condition of the proximity sensor system.

* * * * *